(12) United States Patent
Darolia et al.

(10) Patent No.: US 7,318,955 B2
(45) Date of Patent: Jan. 15, 2008

(54) THERMAL BARRIER COATING WITH MODULATED GRAIN STRUCTURE AND METHOD THEREFOR

(75) Inventors: Ramgopal Darolia, West Chester, OH (US); Brett Allen Rohrer Boutwell, Liberty Township, OH (US); Brian Thomas Hazel, Cincinnati, OH (US); Bangalore Aswatha Nagaraj, West Chester, OH (US); Joseph David Rigney, Milford, OH (US); Roger D. Wustman, Mason, OH (US)

(73) Assignee: General Electric Company, Schenectady, NY (US)

( * ) Notice: Subject to any disclaimer, the term of this patent is extended or adjusted under 35 U.S.C. 154(b) by 127 days.

(21) Appl. No.: 10/711,364

(22) Filed: Sep. 14, 2004

(65) Prior Publication Data

US 2006/0057406 A1     Mar. 16, 2006

(51) Int. Cl.
*B32B 9/00* (2006.01)
(52) U.S. Cl. .................. 428/141; 428/148; 428/469; 428/701; 428/702; 416/241 B
(58) Field of Classification Search .............. None
See application file for complete search history.

(56) References Cited

U.S. PATENT DOCUMENTS 5,652,044 A    7/1997   Rickerby .................... 428/216
5,876,860 A    3/1999   Marijnissen et al. ........ 428/623
6,063,435 A    5/2000   Schulz et al. ............. 427/126.3
6,126,400 A  * 10/2000  Nichols et al. .......... 416/241 B
6,183,884 B1   2/2001   Rickerby ................... 428/623
6,455,173 B1   9/2002   Marijnissen et al. ........ 428/623
6,764,779 B1   7/2004   Liu et al. ................... 428/702

FOREIGN PATENT DOCUMENTS

WO   WO99/35306   *  7/1999
WO   WO9965626       12/1999

* cited by examiner

*Primary Examiner*—Jennifer C. McNeil
*Assistant Examiner*—Timothy M. Speer
(74) *Attorney, Agent, or Firm*—William Scott Andes; Gary M. Hartman; Domenica N. S. Hartman

(57) ABSTRACT

Thermal barrier coating (TBC) and a method of depositing a TBC having a modulated columnar microstructure that exhibits increased impact resistance. The TBC is deposited to have a columnar microstructure in which columns extend from a substrate surface. The columns having inner regions contacting the surface, outer regions near an outermost surface of the TBC, and interior regions therebetween. The inner regions of the columns are substantially normal to the substrate surface and at least one of the interior and outer regions of the columns are nonaligned with its respective inner regions, so that the columns of the columnar microstructure are continuous but modulated between the inner and outer regions to reduce tensile stresses within the columns resulting from particle impact.

31 Claims, 5 Drawing Sheets

THERMAL BARRIER COATING WITH MODULATED GRAIN STRUCTURE AND METHOD THEREFOR

BACKGROUND OF THE INVENTION

The present invention generally relates to coatings for components exposed to high temperatures, such as the hostile thermal environment of a gas turbine engine. More particularly, this invention is directed to thermal barrier coatings having modulated columnar microstructures that increase the impact resistance of the coatings.

Components within the hot gas path of gas turbine engines are often protected by a thermal barrier coating (TBC). TBC's are typically formed of ceramic materials deposited by plasma spraying, flame spraying and physical vapor deposition (PVD) techniques. Various ceramic materials have been proposed for TBC's, the most widely used being zirconia ($ZrO_2$) partially or fully stabilized by yttria ($Y_2O_3$), magnesia (MgO), or ceria ($CeO_2$) to yield a tetragonal microstructure that resists phase changes. Yttria-stabilized zirconia (YSZ), and particularly YSZ containing about six to eight weight percent yttria (6-8% YSZ), has been the most widely used TBC material due at least in part to its high temperature capability, low thermal conductivity, and relative ease of deposition by plasma spraying, flame spraying and PVD techniques. To promote adhesion of TBC to metallic substrates, such as superalloys used in gas turbine engine applications, a metallic bond coat is usually deposited on the substrate before applying the TBC. Bond coats are typically an aluminum-rich composition, such as an overlay coating of an MCrAlX alloy or a diffusion coating such as a diffusion aluminide or a diffusion platinum aluminide. As a result of oxidation, bond coats formed of these compositions develop an aluminum oxide (alumina) scale that chemically bonds the TBC to the bond coat and the underlying substrate.

Spraying techniques deposit TBC material in the form of molten "splats," resulting in a TBC characterized by a degree of inhomogeneity and porosity. TBC's employed in the highest temperature regions of gas turbine engines are most often deposited by PVD, particularly electron-beam PVD (EBPVD), which yields a strain-tolerant columnar grain structure that is able to expand and contract without causing damaging stresses that lead to spallation. Similar columnar microstructures can be produced using other atomic and molecular vapor processes, such as sputtering (e.g., high and low pressure, standard or collimated plume), ion plasma deposition, and all forms of melting and evaporation deposition processes (e.g., laser melting, etc.).

In addition to being well adhered and having low thermal conductivities, TBC's on gas turbine engine components are required to withstand damage from impact by hard particles of varying sizes that are generated upstream in the engine or enter the high velocity gas stream through the air intake of a gas turbine engine. The result of impingement can be erosive wear (generally from smaller particles) or impact spallation from larger particles. Impact spallation is a primary issue at and near the leading edge of gas turbine engine blades and vanes, where the likelihood of damage from impact spallation is sufficiently high that the thermal protection of TBC deposited on a leading edge of a blade or vane is often not taken into consideration when designing the blade or vane. As a consequence, greater amounts of cooling air are necessary to maintain an acceptable blade/vane surface temperature.

FIG. 1 depicts one of the mechanisms of damage caused by a particle 20 impacting a TBC 14 adhered with a bond coat 12 to a substrate 10. The TBC 14 is represented as having a columnar grain structure of the type described above. As such, the TBC 14 comprises individual columns 16 separated by gaps 18, resulting in a porous microstructure. An interface 26 exists between the TBC 14 and bond coat 12, where adhesion between the TBC 14 and bond coat 12 is promoted by alumina scale (not shown). The impacting particle 20 generates stress waves 22 in the outer surface region of the impacted columns 16. The stress waves 22 travel downward through the impacted columns 16, arriving at the interface 26 as reflected stress waves 24. The stresses generated by the stress waves 22 and 24 are compressive in the first few columns 16, but become tensile in succeeding columns 16 (as viewed in FIG. 1, those columns 16 to the right of the impacted columns 16). When these tensile stresses reach the interface 26 between the TBC 14 and bond coat 12, separation of the TBC 14 at the interface 26 can occur depending on the magnitude of the tensile stresses. In such an event, the TBC 14 completely separates (spalls) from the bond coat 12.

Commonly-assigned U.S. Pat. No. 6,352,788 to Bruce teaches that YSZ containing about one up to less than six weight percent yttria in combination with magnesia and/or hafnia exhibits improved impact resistance. In addition, commonly-assigned U.S. Pat. No. 7,060,365 to Bruce shows that small additions of lanthana, neodymia and/or tantala to zirconia partially stabilized by about four weight percent yttria (4% YSZ) can improve the impact resistance of 4% YSZ. It would be desirable if further improvements in impact resistance could be obtained.

BRIEF SUMMARY OF THE INVENTION

The present invention provides TBC's and methods of depositing TBC's having modulated columnar microstructures that increase the impact resistance of the coatings.

A TBC of this invention is formed of a ceramic material and has a columnar microstructure in which columns extend from the surface of the substrate on which the TBC was deposited. The columns have inner regions contacting the substrate surface, outer regions near an outermost surface of the TBC, and interior regions therebetween. The inner regions of the columns are substantially normal to the surface of the substrate, while at least one of the interior and outer regions of the columns are nonaligned with their inner regions, so that the columns of the columnar microstructure are continuous but modulated between the inner and outer regions to reduce tensile stresses within the columns resulting from particle impact. According to the invention, such modulation of the columns reduces the likelihood that cracks resulting from particle impact will form in the inner regions of the columns, and instead will more likely form within the outer regions of the columns, with the result that impact damage of the TBC is similar to erosive wear instead of impact spallation.

TBC's as described above can be deposited by a line-of-sight vapor deposition technique that involves continuous or reversing rotation of the substrate about an axis of rotation thereof, and also oscillation (pitching) of the axis of rotation. During deposition of the inner regions of the columns, the axis of rotation of the substrate is oriented substantially perpendicular to the direction of vapor flow from a source of the ceramic material. To deposit the interior and outer regions of the columns, the axis of rotation is oscillated (pitched) relative to the vapor flow direction.

A significant advantage of this invention is the improved impact resistance associated with the modulated columnar structure of the TBC above the inner regions of the TBC columns. As a result of the modulated columnar structure, TBC separation/spallation can be inhibited to the extent that spallation at the leading edge of a turbine blade or vane is significantly reduced or eliminated, thereby reducing the amount of cooling air required by the blade/vane. Another advantage is that existing processing technology can be readily operated to achieve the desired microstructures and performance.

Other objects and advantages of this invention will be better appreciated from the following detailed description.

DETAILED DESCRIPTION OF THE INVENTION

Figure 1:
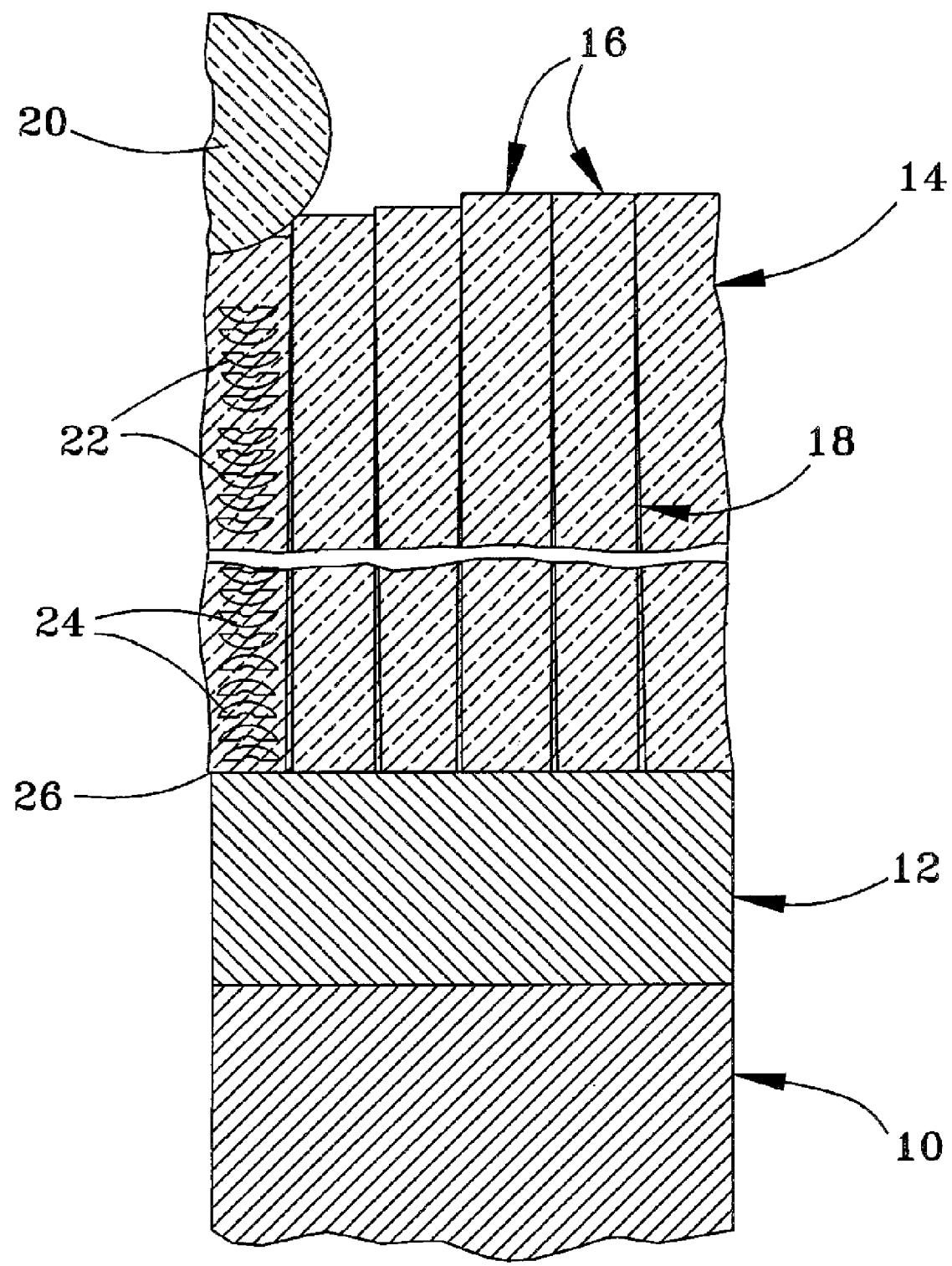
FIG. 1 represents a fragmentary cross-sectional view of an impact event occurring in a columnar TBC.

The present invention is applicable to a variety of components subjected to high temperatures, such as the high and low pressure turbine nozzles and blades, vanes, shrouds, combustor liners and augmentor hardware of gas turbine engines. The invention is particularly desirable for use on high pressure turbine blades and vanes, whose leading edges are subjected to particulate impact. The TBC is part of a TBC system that typically includes a metallic bond coat that bonds the TBC to the component surface. The bond coat is preferably an aluminum-rich diffusion coating, an MCrAlX overlay coating, or a more recently developed beta-phase NiAl intermetallic overlay coating of a type disclosed in commonly-assigned U.S. Pat. No. 5,975,852 to Nagaraj et al., U.S. Pat. No. 6,291,084 to Darolia et al., U.S. Pat. No. 6,153,313 to Rigney et al, and U.S. Pat. No. 6,255,001 to Darolia. Such a bond coat develops an aluminum oxide (alumina) scale as a result of oxidation during deposition of the TBC and high temperature excursions during engine operation. The alumina scale chemically bonds the TBC to the bond coat and, therefore, the underlying component surface.

The TBC can be formed of a variety of ceramic materials, a notable example of which is zirconia partially stabilized by yttria (e.g., about 4-8 wt. % YSZ). Other suitable ceramic materials for the TBC include materials formulated to have lower coefficients of thermal conductivity (low-k) than 7% YSZ, notable examples of which are disclosed in commonly-assigned U.S. Pat. No. 6,586,115 to Rigney et al., U.S. Pat. No. 6,686,060 to Bruce et al., U.S. Pat. No. 7,060,365 to Bruce, U.S. Pat. No. 6,808,799 to Darolia et al., and U.S. Pat. No. 6,890,668 to Bruce et al., and U.S. Pat. No. 6,025,078 to Rickerby. Still other suitable ceramic materials for the TBC include those that resist spallation from contamination by compounds such as CMAS (a relatively low-melting eutectic of calcia, magnesia, alumina and silica). For example, the TBC can be formed of a material capable of interacting with molten CMAS to form a compound with a melting temperature that is significantly higher than CMAS, so that the reaction product of CMAS and the material does not melt and infiltrate the TBC. Examples of CMAS-resistant coatings include alumina, alumina-containing YSZ, and hafnia-based ceramics disclosed in commonly-assigned U.S. Pat. Nos. 5,660,885, 5,683,825, 5,871,820, 5,914,189, 6,627,323, 6,720,038, and 6,890,668, whose disclosures regarding CMAS-resistant coating materials are incorporated herein by reference. Other potential ceramic materials for the TBC include those formulated to have erosion and/or impact resistance better than 7% YSZ. Examples of such materials include certain of the above-noted CMAS-resistant materials, particularly alumina as reported in U.S. Pat. Nos. 5,683,825 and 6,720,038. Other erosion and impact-resistant compositions include reduced-porosity YSZ as disclosed in commonly-assigned U.S. Pat. No. 6,982,126 and U.S. patent application Ser. No. 10/708,020, fully stabilized zirconia (e.g., more than 17% YSZ) as disclosed in commonly-assigned U.S. patent application Ser. No. 10/708,020, and chemically-modified zirconia-based ceramics. Finally, TBC's of particular interest to the present invention have a strain-tolerant microstructure of columnar grains. As known in the art, such columnar microstructures can be achieved by depositing the TBC using a physical vapor deposition technique, such as EBPVD or another atomic and molecular vapor process, as well as known melting and evaporation deposition processes. The TBC is deposited to a thickness that is sufficient to provide the required thermal protection for the component, generally on the order of about 75 to about 300 micrometers. Examples of such materials include certain of the above-noted CMAS-resistant materials, particularly alumina as reported in U.S. Pat. No. 5,683,825 and U.S. patent application Ser. No. 10/073,564. Other erosion and impact-resistant compositions include reduced-porosity YSZ as disclosed in commonly-assigned U.S. patent application Ser. Nos. 10/707,197 and 10/708,020, fully stabilized zirconia (e.g., more than 17% YSZ) as disclosed in commonly-assigned U.S. patent application Ser. No. 10/708,020, and chemically-modified zirconia-based ceramics. Finally, TBC's of particular interest to the present invention have a strain-tolerant microstructure of columnar grains. As known in the art, such columnar microstructures can be achieved by depositing the TBC using a physical vapor deposition technique, such as EBPVD or another atomic and molecular vapor process, as well as known melting and evaporation deposition processes. The TBC is deposited to a thickness that is sufficient to provide the required thermal protection for the component, generally on the order of about 75 to about 300 micrometers.

Figure 2:
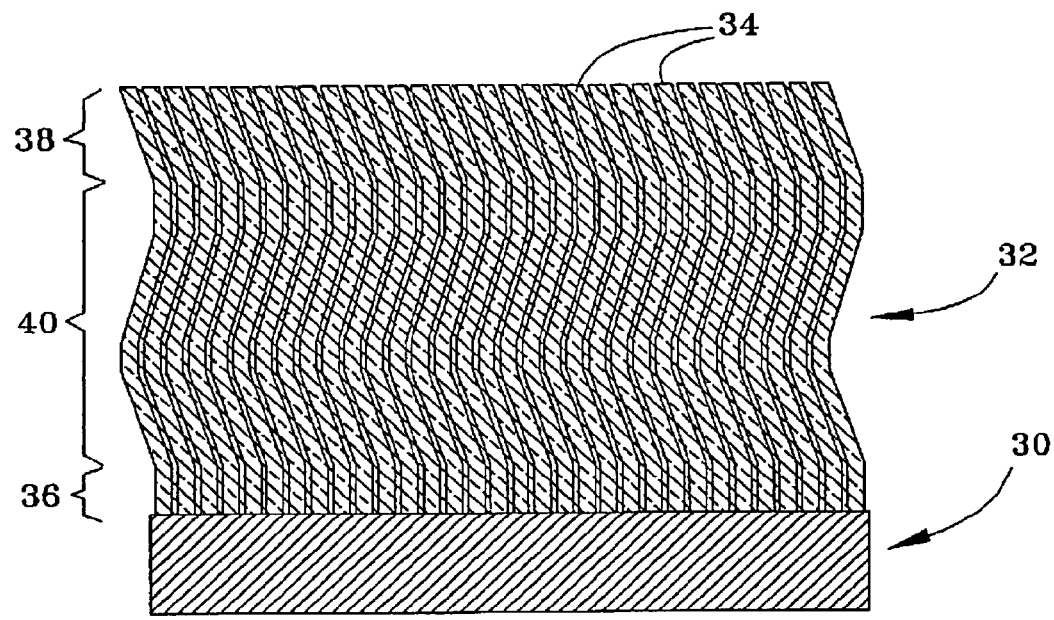
FIGS. 2 and 3 schematically represent fragmentary cross-sectional views of TBC's having modulated columnar grain structures in accordance with two embodiments of this invention.
Figure 3:
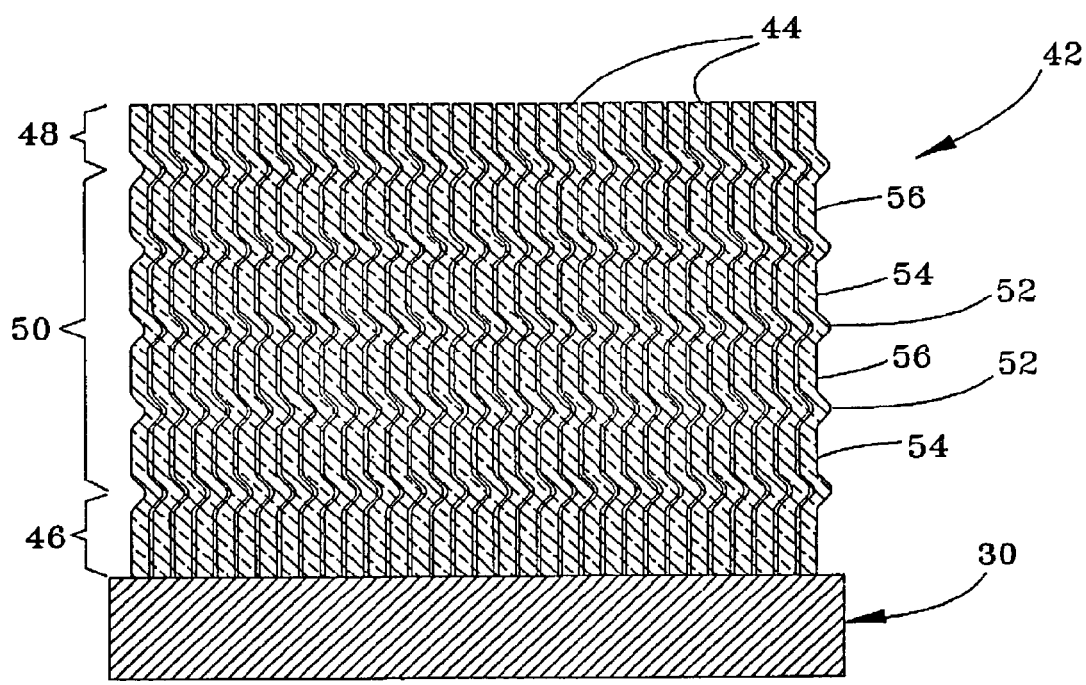

FIGS. 2 and 3 represent two of multiple possible TBC microstructures within the scope of the present invention. In each case, a TBC 32 and 42 is shown deposited on a substrate 30, which may be the surface of a component or a coating on a component, such as the superalloy 10 and bond coat 12, respectively, of FIG. 1. In addition, each TBC 32 and 42 is shown as having a columnar microstructure comprising discrete, continuous columns 34 and 44 that extend from the surface of the substrate 30 to the outermost surface of the TBC 32 and 42. As such, the TBC's 32 and 42 do not contain discrete layers of columns separated by distinct interfaces. As typical with columnar TBC microstructures, the columns 34 and 44 are generally equally spaced from each other along their lengths.

In FIG. 2, the TBC 32 generally has three regions: an inner region 36, an outermost surface region 38, and an interior region 40 therebetween. The inner region 36 of each column 34 can be seen to be oriented substantially perpendicular to the surface of the substrate 30. The surface regions 38 of the columns 34 are not aligned with their respective inner regions 36, which as used herein means the axes of the columns 34 within their inner and surface regions 36 and 38 are not coaxial or parallel. Furthermore, the columns 34 within the interior region 40 are not linear, but instead the axes of the columns 34 follow substantially parallel paths that are periodically diverted in one direction and then another (e.g., opposite) direction. The TBC 42 represented in FIG. 3 is also indicated as generally having an inner region 46, an outermost surface region 48, and an interior region 50. As with the TBC 32 of FIG. 2, the inner region 46 of each column 44 is substantially perpendicular to the surface of the substrate 30, and thereafter the axes of the columns 44 follow substantially parallel paths that are periodically diverted in one direction and then another (e.g., opposite) direction. In contrast to FIG. 2, the axes of the columns 44 within the surface and interior regions 48 and 50 are substantially coaxial or at least parallel (and therefore aligned) with their respective inner regions 46, except for localized curved regions 52 between adjacent linear portions 54 and 56 within the interior region 50 in which excursions of the columns 44 periodically and briefly occur. In each of FIGS. 2 and 3, the organized, coherent and coinciding changes in directions of the column axes along the lengths of the columns 34 and 44 create what is termed herein a modulated microstructure.

According to the invention, the substantially perpendicular orientation of the inner regions 36 and 46 of the columns 34 and 44 promotes adhesion of the TBC's 32 and 42 to the substrate 30, while the modulations created in the columnar microstructures of the TBC's 32 and 42 above their inner regions 36 and 46 reduce the magnitude of the tensile stresses that reach the inner regions 36 and 46 of the columns 34 and 44 and the interface between the TBC's 32 and 42 and their underlying substrates 30. As a result, instead of TBC separation at the interface with the substrates 30, the TBC columns 34 and 44 are more likely to crack within the outer surface regions 38 and 48 of the TBC's 32 and 42. In this manner, particle impact damage to the TBC's 32 and 42 is more likely to occur in the form of eroding and/or chipping away of the columns 34 and 44 as the stress waves travel downward through the columns 34 and 44, such that the damage due to impact events is essentially converted from impact spallation to a gradual removal of the TBC's 32 and 42 by surface erosion and chipping.

While the inner, interior and outer regions 36, 38, 40, 46, 48, and 50 may be deposited to have the same composition, it is foreseeable that they could be formed of different materials to enhance the overall properties of the TBC's 32 and 42. For example, the inner regions 36 and 46 could be formed of a conventional YSZ composition (e.g., 7% YSZ), while one or both of the interior and outer regions 38, 40, 48, and 50 could be formed of one or more of the above-noted materials having lower thermal conductivities, greater CMAS-resistance, and/or greater erosion resistance than the underlying YSZ of the inner regions 36 and 46.

Modulated TBC microstructures of the type represented in FIGS. 2 and 3 can be obtained by combinations of rotation, rocking, and oscillation motions performed with the surface being coated (e.g., the substrates 30 of FIGS. 2 and 3) during the process of depositing the TBC's 32 and 42. Rotation is meant to refer to the rotation of a component about an axis thereof, while a rocking motion is the periodic reversal of a rotational movement. As used herein, oscillation refers to the periodic pitching of the rotational axis of a component. For example, with a component oriented so that its axis of rotation is generally perpendicular to a line between the component and the source of the coating material being deposited, oscillation may be performed between the initial, generally horizontal orientation of the component to a pitch-up or pitch-down orientation relative to the source.

Figure 7:
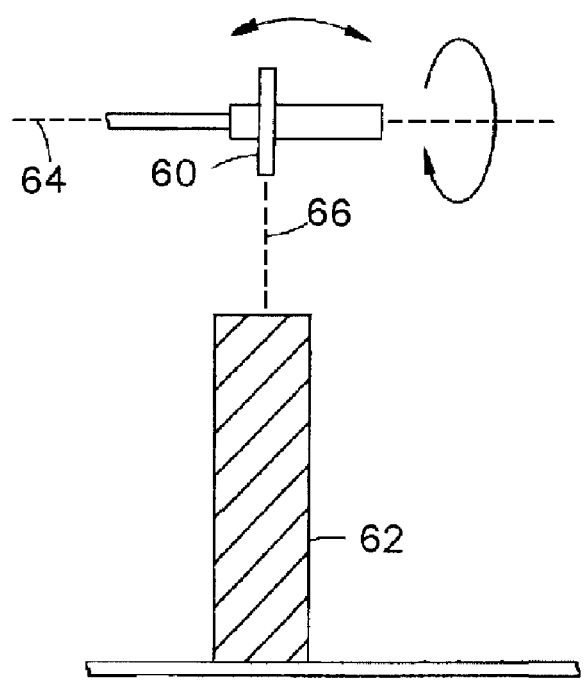
FIG. 7 schematically represents a portion of a line-of-sight deposition apparatus for carrying of processes capable of depositing modulated columnar TBC's of this invention.

While a variety of combinations of rotation/rocking and oscillation are possible, the following sets forth six particular examples of deposition processes believed to be capable of producing modulated TBC microstructures of the type described above. The processes presume deposition is carried out by a line-of-sight process such as EBPVD, though it should be understood that another atomic and molecular vapor process, as well as other known melting and evaporation deposition processes, could be used. As discussed above and represented in FIG. 7, all of these processes are carried out so that the component (e.g., blade or vane) 60 is initially horizontally oriented directly above a source (e.g., ingot) 62 of the coating material, so that the axis of rotation 64 of the component 60 is generally perpendicular to an imaginary line 66 between the component 60 and the source 62. As used herein, the terms "oscillate" and "pitch" refer to a change in the orientation of the component 60 that results in a change in the angle between the component axis 64 and the imaginary line 66. Finally, values for such process parameters as rotational speed, oscillation angles, time periods, are provided, though such values are to be considered only suitable examples. For example, rotational speeds of about 2 to 20 rpm are believed to be acceptable for carrying out the invention. Furthermore, coating processes are generally targeted for completion in about 600 to about 3000 seconds, though longer and shorter processes are also within the scope of the invention.

Constant rotation with on/off oscillation:

a. Initiate coating process by depositing for about 120 seconds while the component is substantially horizontal and is rotated at a substantially constant 14 rpm.
b. For a period of about 400 seconds, deposit while the component is oscillated between horizontal and a forty-degree down orientation and while maintaining 14 rpm constant rotation.
c. Discontinue oscillation and, with the component again oriented horizontally, maintain 14 rpm constant rotation for about 150 seconds.
d. Repeat step b.
e. Repeat step c.
f. Repeat step b.

Rocking rotation with on/off oscillation:

a. Initiate coating process by depositing for about 120 seconds while the component is substantially horizontal and is rotated at a substantially constant 14 rpm.
b. For a period of about 400 seconds, deposit while the component is oscillated between horizontal and a forty-degree down orientation and while maintaining 14 rpm constant rotation.

c. Discontinue oscillation and, with the component again oriented horizontal, initiate a +90 to −90 degree rocking rotation at a speed of about 14 rpm for about 150 seconds.
d. Repeat step b.
e. Repeat step c.
f. Repeat step b.

Ninety-degree integer rotation without oscillation:
a. Initiate coating process by depositing for about 50 seconds while the component is held stationary in the horizontal position.
b. Rotate the component about ninety degrees and hold for about 50 seconds.
c. Continue periodic rotation and hold procedure at 50 second intervals.

Constant rotation with integer oscillation:
a. Initiate coating process by depositing for about 100 seconds while the component is substantially horizontal and is rotated at a substantially constant 14 rpm.
b. Oscillate (pitch) the component down to about forty degrees from horizontal and hold for about 50 seconds while maintaining 14 rpm constant rotation.
c. Oscillate (pitch) the component up to about forty degrees from horizontal and hold for about 50 seconds while maintaining 14 rpm constant rotation.
d. Repeat step b.
e. Repeat step c.

Constant rotation with stepped oscillation:
a. Initiate coating process by depositing for about 100 seconds while the component is substantially horizontal and is rotated at a substantially constant 14 rpm.
b. Oscillate (pitch) the component down to about forty degrees from horizontal and hold for about 50 seconds while maintaining 14 rpm constant rotation.
c. Return the component to horizontal and hold for 50 seconds while maintaining 14 rpm constant rotation.
d. Oscillate (pitch) the component up to about forty degrees from horizontal and hold for about 100 seconds while maintaining 14 rpm constant rotation.
e. Repeat step b.
f. Repeat step c.
g. Repeat step d.

Constant rotation with oscillation to increase waviness of the TBC:
a. Initiate coating process by depositing for about 120 seconds while the component is substantially horizontal and is rotated at a substantially constant 14 rpm.
b. Oscillate (pitch) the component down to about forty degrees from horizontal over an extended interval of about 30 seconds while maintaining 14 rpm constant rotation.
c. Hold the component in the forty-degree down orientation for about 100 seconds while maintaining 14 rpm constant rotation.
d. Return the component to horizontal over an extended interval of about 30 seconds while maintaining 14 rpm constant rotation.
e. Hold the component at the horizontal orientation for about 100 seconds while maintaining 14 rpm constant rotation.
f. Oscillate (pitch) the component up to about forty degrees from horizontal over an extended interval of about 30 seconds while maintaining 14 rpm constant rotation.
g. Hold the component in the forty-degree up orientation for about 100 seconds while maintaining 14 rpm constant rotation.
h. Return the component to horizontal over an extended interval of about 30 seconds while maintaining 14 rpm constant rotation.
I. Hold the component at the horizontal orientation for about 100 seconds while maintaining 14 rpm constant rotation.
j. Repeat steps b-I.

Figure 8:
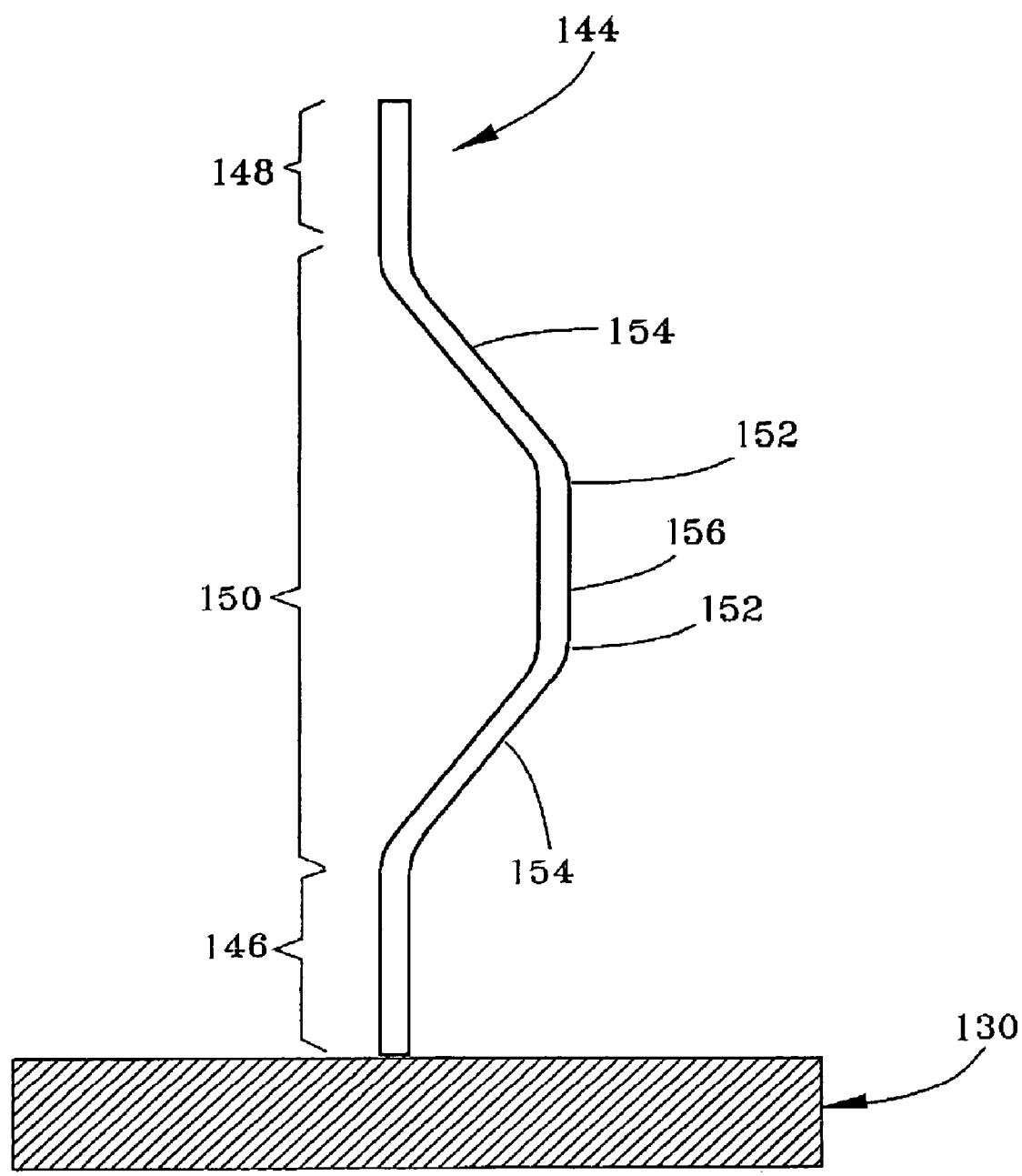
FIG. 8 schematically represents a grain of a TBC having a modulated columnar grain structure in accordance with another embodiment of this invention.

A grain column 144 produced by this process is represented in FIG. 8, with reference numbers identifying features of the column 144 corresponding to features shown in FIG. 3, but with a numerical prefix (1) added to distinguish this embodiment from the embodiment of FIG. 3.

In view of the above, modulated TBC microstructures can be obtained using existing processing technology with equipment operated in a modified manner to achieve the desired rotation, rocking and oscillation of a component. As a result of the improved impact resistance of the modulated microstructure that reduces the likelihood of TBC spallation at the TBC/bond coat interface, TBC's of this invention are believed to be capable of surviving on surfaces of components that are prone to impact spallation, including the leading edges of turbine blades and vanes.

Figure 4:
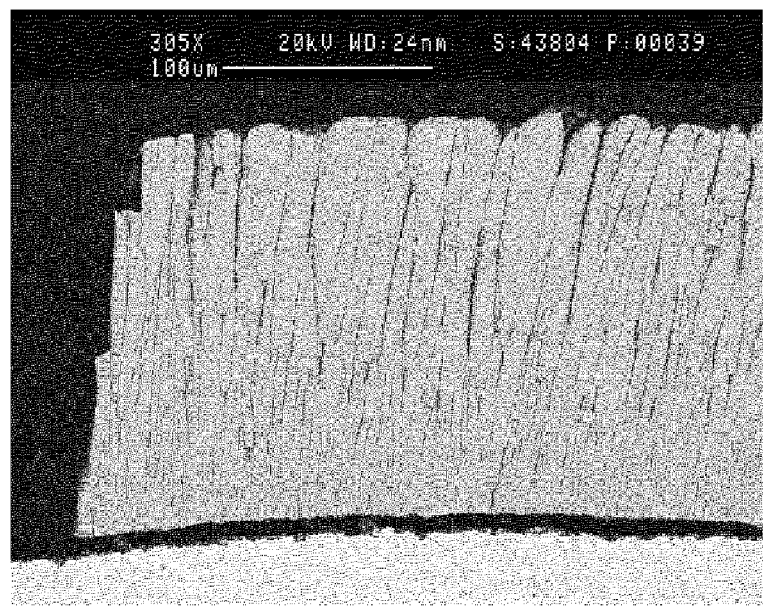
FIG. 4 is a scanned image of a cross-section of a prior art TBC that suffered localized spallation as a result of impact damage.
Figure 5:
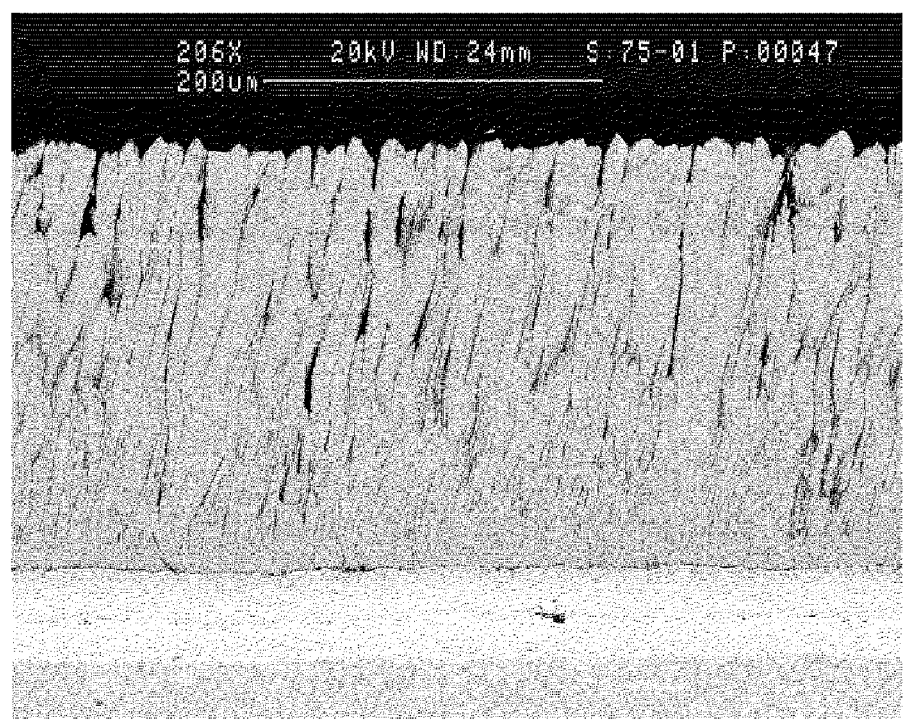
FIGS. 5 and 6 are scanned images of cross-sections of TBC's with modulated columnar grain structures in accordance with the present invention.
Figure 6:
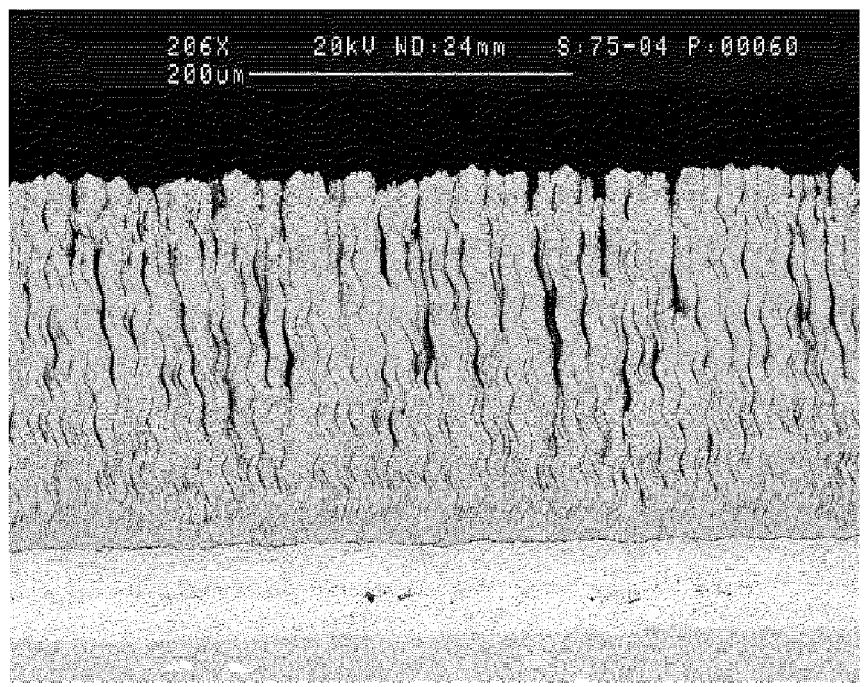

FIG. 4 is a microphotograph representative of an EBPVD-deposited columnar 7% YSZ TBC of the prior art (e.g., corresponding to FIG. 1) and having a spalled region as a result of impact damage. For comparison, FIGS. 5 and 6 are microphotographs of two 7% YSZ TBC's deposited by EBPVD to a thickness of about 250 micrometers) with modulated microstructures in accordance with the present invention. The TBC of FIG. 5 was deposited using the "on/off oscillation with constant rotation" procedure described above, and the TBC of FIG. 6 was deposited using the "stepped oscillation with constant rotation" procedure described above. These TBC's underwent a standard particle impact test performed at about 2230° F. (about 1220° C.) using alumina particles with diameters of about 560 micrometers, fired in clusters of about 100 grams at about 30 feet per second (about 10 m/s). Using such a test, an average of about 105 grams of particles per mil (about 25 micrometers) of coating thickness would be sufficient to completely spall a region of a standard 7% YSZ TBC (e.g., FIG. 4). In contrast, about 120 grams of particles per mil of coating thickness were required to completely spall a region of the TBC of FIG. 5 (an improvement of about 14%), and about 145 grams of particles per mil of coating thickness were required to completely spall a region of the TBC of FIG. 6 (an improvement of about 38%).

While the invention has been described in terms of particular embodiments, it is apparent that other forms could be adopted by one skilled in the art. Therefore, the scope of the invention is to be limited only by the following claims.

What is claimed is:

1. A thermal barrier coating on a surface of a substrate, the thermal barrier coating being formed of at least one ceramic material and having a columnar microstructure comprising columns extending from the surface of the substrate, the columns having inner regions contacting the surface of the substrate, outer regions near an outermost surface of the thermal barrier coating, and interior regions therebetween, the inner regions of the columns being substantially normal to the surface of the substrate and the interior regions of the columns comprising multiple first portions and multiple second portions between the first portions so that each adjacent pair of the first portions is separated by one of the second portions, at least one of the first and second portions being linear, at least one adjacent pair of the first and second portions being separated and adjoined by a curved portion so that the columns of the columnar microstructure are continuous but modulated within the interior regions.

2. A thermal barrier coating according to claim 1, wherein the thermal barrier coating is characterized by the substantial absence of columns that are discontinuous between the surface of the substrate and the outermost surface of the thermal barrier coating, whereby the inner, interior and outer regions are not discrete layers and are not separated by distinct interfaces.

3. A thermal barrier coating according to claim 1, wherein adjacent pairs of the columns are substantially equally spaced from each other along the inner, interior and outer regions thereof.

4. A thermal barrier coating according to claim 1, wherein the surface of the substrate is defined by a metallic bond coat that promotes adhesion of the thermal barrier coating to the substrate.

5. A thermal barrier coating according to claim 1, wherein the ceramic material within the inner, interior and outer regions has the same composition.

6. A thermal barrier coating according to claim 5, wherein the ceramic material consists essentially of zirconia and yttria.

7. A thermal barrier coating according to claim 1, wherein the ceramic material of at least one of the inner, interior and outer regions is chosen from the group consisting of ceramic materials having a lower thermal conductivity than zirconia stabilized by seven weight percent yttria, ceramic materials having greater CMAS-resistance than zirconia stabilized by seven weight percent yttria, and ceramic materials having greater erosion resistance than zirconia stabilized by seven weight percent yttria.

8. A thermal barrier coating according to claim 1, wherein the substrate is a gas turbine engine component.

9. A thermal barrier coating according to claim 8, wherein the component is a turbine blade.

10. A thermal barrier coating according to claim 8, wherein the component is a vane.

11. A thermal barrier coating according to claim 10, wherein the surface of the substrate is a leading edge of the component.

12. A thermal barrier coating according to claim 1, wherein at least one of the first and second portions within the interior region of each column is linear and aligned with its respective inner region.

13. A thermal barrier coating according to claim 1, wherein the first and second portions of at least one adjacent pair of the first and second portions within the interior region of each column are linear and aligned with their respective inner region.

14. A thermal barrier coating according to claim 1, wherein at least one of the first and second portions within the interior region of each column is linear and nonaligned with its respective inner region.

15. A thermal barrier coating according to claim 1, wherein the first portions of the interior regions are linear and aligned with their respective inner regions and the second portions of the interior regions are linear and non-aligned with their respective inner regions.

16. A thermal barrier coating according to claim 1, wherein the first and second portions of the interior regions are linear and nonaligned with their respective inner regions and oriented in opposite directions from a normal to the surface of the substrate.

17. A thermal barrier coating according to claim 1, wherein the second portions of the interior regions are linear and nonaligned with their respective inner regions and alternatingly oriented in opposite directions from a normal to the surface of the substrate.

18. A coating system on a surface of a gas turbine engine component, the coating system comprising a bond coat on the surface and a thermal barrier coating on the bond coat, the thermal barrier coating being formed of a ceramic material and having a columnar microstructure comprising columns extending from the surface of the component, the columns having inner regions contacting the surface of the component, outer regions at an outermost surface of the thermal barrier coating, and interior regions therebetween, the ceramic material within the inner, interior and outer regions substantially having the same composition, the inner regions of the columns being substantially normal to the surface of the substrate and the interior regions of the columns comprising multiple first portions and multiple second portions between the first portions so that each adjacent pair of the first portions is separated by one of the second portions, at least one of the first and second portions being linear, at least one adjacent pair of the first and second portions being separated and adjoined by a curved portion so that the columns of the columnar microstructure are continuous but modulated within the interior regions.

19. A coating system according to claim 18, wherein the thermal barrier coating is characterized by the substantial absence of columns that are discontinuous between the surface of the component and the outermost surface of the thermal barrier coating, whereby the inner, interior and outer regions are not discrete layers and are not separated by distinct interfaces.

20. A coating system according to claim 18, wherein adjacent pairs of the columns are substantially equally spaced from each other along the inner, interior and outer regions thereof.

21. A coating system according to claim 18, wherein the ceramic material consists essentially of zirconia and yttria.

22. A coating system according to claim 18, wherein the ceramic material of at least one of the inner, interior and outer regions is chosen from the group consisting of ceramic materials having a lower thermal conductivity than zirconia stabilized by seven weight percent yttria, ceramic materials having greater CMAS-resistance than zirconia stabilized by seven weight percent yttria, and ceramic materials having greater erosion resistance than zirconia stabilized by seven weight percent yttria.

23. A coating system according to claim 18, wherein the component is a turbine blade.

24. A coating system according to claim 18, wherein the component is a vane.

25. A coating system according to claim 18, wherein the surface of the component is a leading edge of the component.

26. A coating system according to claim 18, wherein at least one of the first and second portions within the interior region of each column is linear and aligned with its respective inner region.

27. A coating system according to claim 18, wherein the first and second portions of at least one adjacent pair of the first and second portions within the interior region of each column are linear and aligned with their respective inner region.

28. A coating system according to claim 18, wherein at least one of the first and second portions within the interior region of each column is linear and nonaligned with its respective inner region.

29. A coating system according to claim 18, wherein the first portions of the interior regions are linear and aligned with their respective inner regions and the second portions of the interior regions are linear and nonaligned with their respective inner regions.

30. A coating system according to claim 18, wherein the first and second portions of the interior regions are linear and nonaligned with their respective inner regions and oriented in opposite directions from a normal to the surface of the substrate.

31. A coating system according to claim 18, wherein the second portions of the interior regions are linear and non-aligned with their respective inner regions and alternatingly oriented in opposite directions from a normal to the surface of the substrate.

* * * * *